United States Patent
King et al.

(10) Patent No.: US 10,826,452 B2
(45) Date of Patent: Nov. 3, 2020

(54) CHARGE PUMP WITH CURRENT MODE OUTPUT POWER THROTTLING

(71) Applicant: Cirrus Logic International Semiconductor Ltd., Edinburgh (GB)

(72) Inventors: Eric J. King, Austin, TX (US); Emmanuel Marchais, Dripping Springs, TX (US)

(73) Assignee: Cirrus Logic, Inc., Austin, TX (US)

( * ) Notice: Subject to any disclaimer, the term of this patent is extended or adjusted under 35 U.S.C. 154(b) by 9 days.

(21) Appl. No.: 15/887,657

(22) Filed: Feb. 2, 2018

(65) Prior Publication Data

US 2018/0234063 A1    Aug. 16, 2018

Related U.S. Application Data

(60) Provisional application No. 62/457,480, filed on Feb. 10, 2017.

(51) Int. Cl.
*H02M 3/07* (2006.01)
*H03G 3/00* (2006.01)
(Continued)

(52) U.S. Cl.
CPC .............. *H03G 3/004* (2013.01); *H02M 3/07* (2013.01); *H03F 1/025* (2013.01); *H03F 1/0211* (2013.01);
(Continued)

(58) Field of Classification Search
CPC ............ H02M 3/02; H02M 3/04; H02M 3/06; H02M 3/07; H02M 3/073;
(Continued)

(56) References Cited

U.S. PATENT DOCUMENTS 5,889,427 A     5/1999  Nakajima
5,973,368 A *  10/1999  Pearce ................ H01L 21/8234
                                                           257/329
(Continued)

FOREIGN PATENT DOCUMENTS

EP         2688201 A1    1/2014
EP         2897270 A1    7/2015
WO    2008074666 A1    6/2008

OTHER PUBLICATIONS

International Search Report and Written Opinion of the International Searching Authority, International Application No. PCT/US2017/056590, dated Jan. 22, 2018.

(Continued)

*Primary Examiner* — Diana J. Cheng
(74) *Attorney, Agent, or Firm* — Jackson Walker L.L.P.

(57) ABSTRACT

A system may include a charge pump configured to boost an input voltage of the charge pump to an output voltage greater than the input voltage, a current mode control loop for current mode control of a power amplifier powered by the output voltage of the charge pump, and a controller configured to, in a current-limiting mode of the controller, control an output power of the charge pump to ensure that an input current of the charge pump is maintained below a current limit, control the power amplifier by placing the power amplifier into a high-impedance mode during the current-limiting mode, and control state variables of a loop filter of the current mode control loop during the current-limiting mode.

12 Claims, 3 Drawing Sheets

(51) Int. Cl.
*H03F 1/02* (2006.01)
*H03F 3/217* (2006.01)
*H03F 3/187* (2006.01)
*H03G 3/30* (2006.01)

(52) U.S. Cl.
CPC .......... *H03F 1/0227* (2013.01); *H03F 3/187* (2013.01); *H03F 3/2173* (2013.01); *H03G 3/3042* (2013.01); *H03F 2200/03* (2013.01); *H03F 2200/471* (2013.01); *H03F 2200/507* (2013.01)

(58) Field of Classification Search
CPC ..... H02M 2003/071; H02M 2003/072; H02M 2003/075; H02M 2003/076; H02M 2003/077; H02M 2003/078; H03F 1/0211; H03F 1/0227; H03F 1/025; H03F 3/187; H03F 3/2173; H03F 3/3042; H03F 2200/03; H03F 2200/471; H03F 2200/507; H03G 3/004; H03G 3/3042; G11C 5/14; G11C 5/145; G11C 5/146
See application file for complete search history.

(56) References Cited

U.S. PATENT DOCUMENTS

| | | |
|---|---|---|
| 5,973,944 A | 10/1999 | Nork |
| 6,055,168 A | 4/2000 | Kotowski et al. |
| 6,185,082 B1 | 2/2001 | Yang |
| 6,226,193 B1 | 5/2001 | Bayer et al. |
| 6,438,005 B1 | 8/2002 | Walter |
| 6,445,623 B1 | 9/2002 | Zhang et al. |
| 6,483,282 B1 | 11/2002 | Bayer |
| 6,504,422 B1 | 1/2003 | Rader et al. |
| 6,512,411 B2 | 1/2003 | Meng et al. |
| 6,570,435 B1 | 5/2003 | Hastings |
| 6,937,487 B1 | 8/2005 | Bron |
| 6,995,995 B2 | 2/2006 | Zeng et al. |
| 7,207,054 B1 | 4/2007 | Richards et al. |
| 7,208,997 B2 | 4/2007 | Sohara |
| 7,256,640 B2 | 8/2007 | Ucciardello et al. |
| 7,304,871 B2 | 12/2007 | Ito et al. |
| 7,605,579 B2 | 10/2009 | Betser et al. |
| 7,990,205 B2 | 8/2011 | Jung |
| 8,013,664 B2 | 9/2011 | Gerber |
| 8,193,853 B2 | 6/2012 | Hsieh et al. |
| 8,264,273 B2 | 9/2012 | MacFarlane |
| 8,311,243 B2 | 11/2012 | Tucker et al. |
| 8,610,492 B2 | 12/2013 | Prabhu et al. |
| 8,729,816 B1 | 5/2014 | Genest |
| 8,963,535 B1 | 2/2015 | Melanson |
| 9,136,755 B2 | 9/2015 | Lesso et al. |
| 9,172,300 B2 | 10/2015 | Li et al. |
| 9,209,757 B1 | 12/2015 | Thandri et al. |
| 9,225,234 B2 | 12/2015 | Ku et al. |
| 9,264,053 B2 | 2/2016 | Englekirk |
| 9,484,799 B2 | 11/2016 | Zhang et al. |
| 9,680,371 B2 | 6/2017 | Saadat et al. |
| 9,819,260 B2 | 11/2017 | Hissink et al. |
| 9,847,712 B2 | 12/2017 | Low et al. |
| 10,283,989 B1 | 5/2019 | Hogan et al. |
| 2003/0085752 A1 | 5/2003 | Rader et al. |
| 2004/0136212 A1 | 7/2004 | Abe et al. |
| 2005/0219878 A1 | 10/2005 | Ito et al. |
| 2006/0250177 A1 | 11/2006 | Thorp et al. |
| 2007/0024347 A1 | 2/2007 | Nagasawa et al. |
| 2007/0146051 A1 | 6/2007 | Tsen |
| 2007/0211502 A1 | 9/2007 | Komiya |
| 2007/0279021 A1 | 12/2007 | Yanagida et al. |
| 2008/0030261 A1 | 2/2008 | Nakata |
| 2008/0054855 A1 | 3/2008 | Hussain et al. |
| 2009/0108681 A1 | 4/2009 | Litovsky |
| 2010/0013548 A1 | 1/2010 | Barrow |
| 2010/0277225 A1 | 11/2010 | Gerber |
| 2011/0298545 A1 | 12/2011 | Morimoto et al. |
| 2014/0055197 A1 | 2/2014 | Khlat |
| 2014/0057684 A1 | 2/2014 | Khlat |
| 2016/0072485 A1 | 3/2016 | Vice et al. |
| 2017/0359652 A1 | 12/2017 | Serwy et al. |
| 2018/0109181 A1 | 4/2018 | King et al. |
| 2018/0120884 A1 | 5/2018 | King et al. |
| 2018/0152101 A1 | 5/2018 | King et al. |

OTHER PUBLICATIONS

International Search Report and Written Opinion of the International Searching Authority, International Application No. PCT/US2017/063429, dated Feb. 16, 2018.
International Search Report and Written Opinion of the International Searching Authority, International Application No. PCT/US2017/059545, dated May 9, 2018.
International Search Report and Written Opinion of the International Searching Authority, International Application No. PCT/US2018/017317, dated May 15, 2018.
International Search Report and Written Opinion of the International Searching Authority, International Application No. PCT/US2018/017322, dated May 16, 2018.

\* cited by examiner

CHARGE PUMP WITH CURRENT MODE OUTPUT POWER THROTTLING

CROSS-REFERENCES AND RELATED APPLICATION

The present disclosure claims benefit of U.S. Provisional Patent Application Ser. No. 62/457,480, filed Feb. 10, 2017, which is incorporated by reference herein in its entirety.

FIELD OF DISCLOSURE

The present disclosure relates in general to charge pump power supplies, including without limitation personal audio devices such as wireless telephones and media players, and more specifically, to systems and methods for throttling output power generated by a charge pump in order to maintain an input current limit to the charge pump.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers, and the power amplifier may often be the primary consumer of power in a personal audio device, and thus, may have the greatest effect on the battery life of the personal audio device. In devices having a linear power amplifier for the output stage, power is wasted during low signal level outputs, because the voltage drop across the active output transistor plus the output voltage will be equal to the constant power supply rail voltage. Therefore, amplifier topologies such as Class-G and Class-H are desirable for reducing the voltage drop across the output transistor(s) and thereby reducing the power wasted in dissipation by the output transistor(s).

In order to provide a variable power supply voltage to such a power amplifier, a charge pump power supply may be used, for example such as that disclosed in U.S. Pat. No. 8,311,243, in which an indication of the signal level at the output of the circuit is used to control the power supply voltage in a Class-G topology. The above-described topology may raise the efficiency of the audio amplifier, in general, as long as periods of low signal level are present in the audio source. Typically in such topologies, a plurality of thresholds define output signal level-dependent operating modes for the charge pump power supply, wherein a different supply voltage is generated by the charge pump power supply in each mode.

In a typical charge pump power supply, a charge pump may operate in accordance with two non-overlapping clock phases of a switching cycle of the charge pump, with different combinations of connections among an input power source to the charge pump (e.g., a battery), a flying capacitor of the charge pump for storing charge, and an output load capacitor which provides the power supply voltage generated by the charge pump. However, one disadvantage of a charge pump may occur when switching between output voltage modes of the charge pump. In general, the voltage on the flying capacitor of the charge pump may be equal to the voltage of the input power source. If the output voltage is smaller than the sum of the input power source voltage and the flying capacitor voltage during an increase in charge pump ratio, the charge pump may need to source a large inrush current from its power source (e.g., a battery). On the other hand, if the output voltage is greater than the sum of the input power source voltage and the flying capacitor voltage, the charge pump may need to sink large current to its power source. Because of the sizes of capacitors often used in charge pumps, the amount of current that a charge pump may source or sink when switching between modes may not be able to be absorbed by the power source to the charge pump, which may lead to system damage. Accordingly, methods and systems for limiting such switching currents are desirable.

Examples of systems and methods for current limiting in amplifiers with boosted charge pump power supplies, and conditions for initiating such current limiting, are described in U.S. application Ser. No. 15/783,506 filed Oct. 13, 2017, U.S. application Ser. No. 15/800,743 filed Nov. 1, 2017, and U.S. application Ser. No. 15/823,140 filed Nov. 27, 2017, all of which are incorporated by reference herein.

SUMMARY

In accordance with the teachings of the present disclosure, certain disadvantages and problems associated with performance of charge pumps have been reduced or eliminated.

In accordance with embodiments of the present disclosure, a system may include a charge pump configured to boost an input voltage of the charge pump to an output voltage greater than the input voltage, a current mode control loop for current mode control of a power amplifier powered by the output voltage of the charge pump, and a controller configured to, in a current-limiting mode of the controller, control an output power of the charge pump to ensure that an input current of the charge pump is maintained below a current limit, control the power amplifier by placing the power amplifier into a high-impedance mode during the current-limiting mode, and control state variables of a loop filter of the current mode control loop during the current-limiting mode.

In accordance with embodiments of the present disclosure, a system may include a charge pump configured to boost an input voltage of the charge pump to an output voltage greater than the input voltage, a current mode control loop for current mode control of a power amplifier powered by the output voltage of the charge pump, and a controller configured to, in a current-limiting mode of the controller, attenuate a reference signal input to the current mode control loop.

In accordance with embodiments of the present disclosure, a method may include, in a current-limiting mode of a system comprising a charge pump configured to boost an input voltage of the charge pump to an output voltage greater than the input voltage and a current mode control loop for current mode control of a power amplifier powered by the output voltage of the charge pump, controlling an output power of the charge pump to ensure that an input current of the charge pump is maintained below a current limit, controlling the power amplifier by placing the power amplifier into a high-impedance mode during the current-limiting mode, and controlling state variables of a loop filter of the current mode control loop during the current-limiting mode.

In accordance with embodiments of the present disclosure, a method may include, in a current-limiting mode of a system comprising a charge pump configured to boost an input voltage of the charge pump to an output voltage greater than the input voltage and a current mode control loop for current mode control of a power amplifier powered by the output voltage of the charge pump, controlling an output power of the charge pump to ensure that an input current of the charge pump is maintained below a current limit, controlling the power amplifier by placing the power amplifier into a high-impedance mode during the current-limiting mode, and attenuating a reference signal input to the current mode control loop.

Technical advantages of the present disclosure may be readily apparent to one having ordinary skill in the art from the figures, description and claims included herein. The objects and advantages of the embodiments will be realized and achieved at least by the elements, features, and combinations particularly pointed out in the claims.

It is to be understood that both the foregoing general description and the following detailed description are explanatory examples and are not restrictive of the claims set forth in this disclosure.

BRIEF DESCRIPTION OF THE DRAWINGS

A more complete understanding of the example, present embodiments and certain advantages thereof may be acquired by referring to the following description taken in conjunction with the accompanying drawings, in which like reference numbers indicate like features, and wherein.

DETAILED DESCRIPTION

Figure 1:
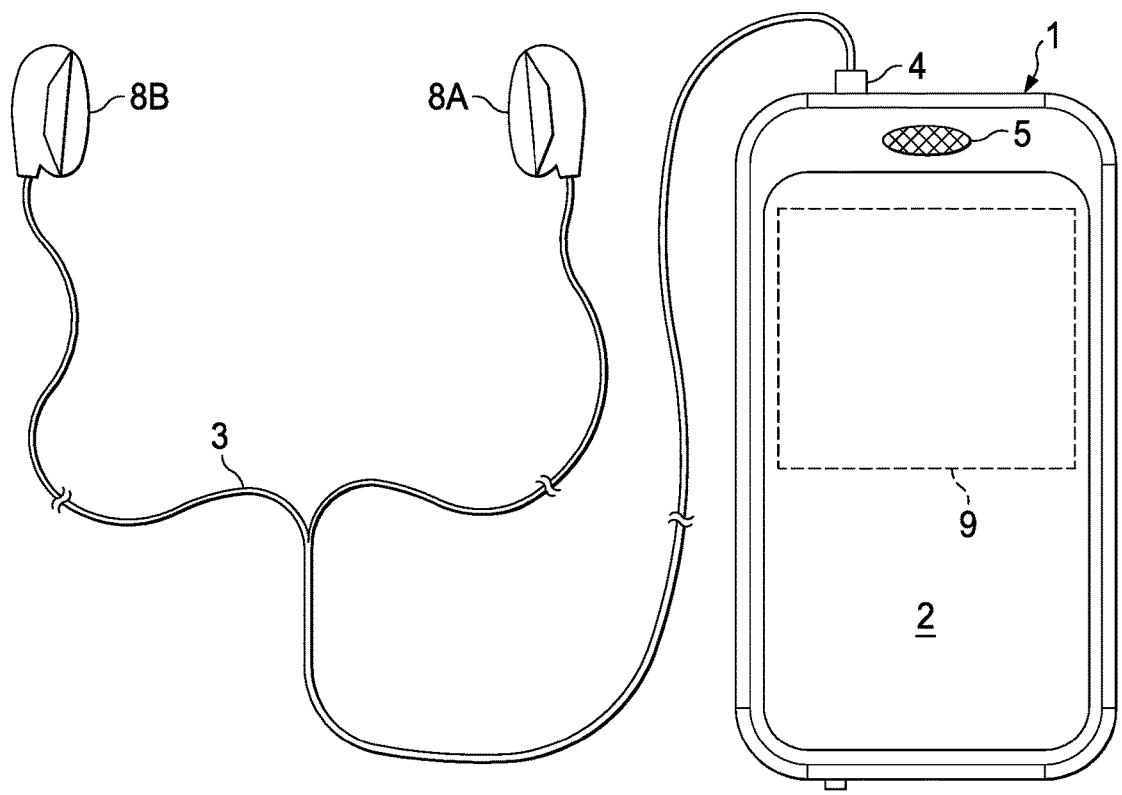
FIG. 1 is an illustration of an example personal audio device, in accordance with embodiments of the present disclosure.

FIG. 1 is an illustration of an example personal audio device 1, in accordance with embodiments of the present disclosure. Personal audio device 1 is an example of a device in which techniques in accordance with embodiments of the present disclosure may be employed, but it is understood that not all of the elements or configurations embodied in illustrated personal audio device 1, or in the circuits depicted in subsequent illustrations, are required in order to practice the subject matter recited in the claims. Personal audio device 1 may include a transducer such as speaker 5 that reproduces distant speech received by personal audio device 1, along with other local audio events such as ringtones, stored audio program material, injection of near-end speech (i.e., the speech of the user of personal audio device 1) to provide a balanced conversational perception, and other audio that requires reproduction by personal audio device 1, such as sources from webpages or other network communications received by personal audio device 1 and audio indications such as a low battery indication and other system event notifications. In addition or alternatively, a headset 3 may be coupled to personal audio device 1 for generating audio. As shown in FIG. 1, a headset 3 may be in the form of a pair of earbud speakers 8A and 8B. A plug 4 may provide for connection of headset 3 to an electrical terminal of personal audio device 1. Headset 3 and speaker 5 depicted in FIG. 1 are merely examples, and it is understood that personal audio device 1 may be used in connection with a variety of audio transducers, including without limitation, captive or integrated speakers, headphones, earbuds, in-ear earphones, and external speakers.

Personal audio device 1 may provide a display to a user and receive user input using a touch screen 2, or alternatively, a standard LCD may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3, speaker 5, and/or another audio transducer.

Figure 2:
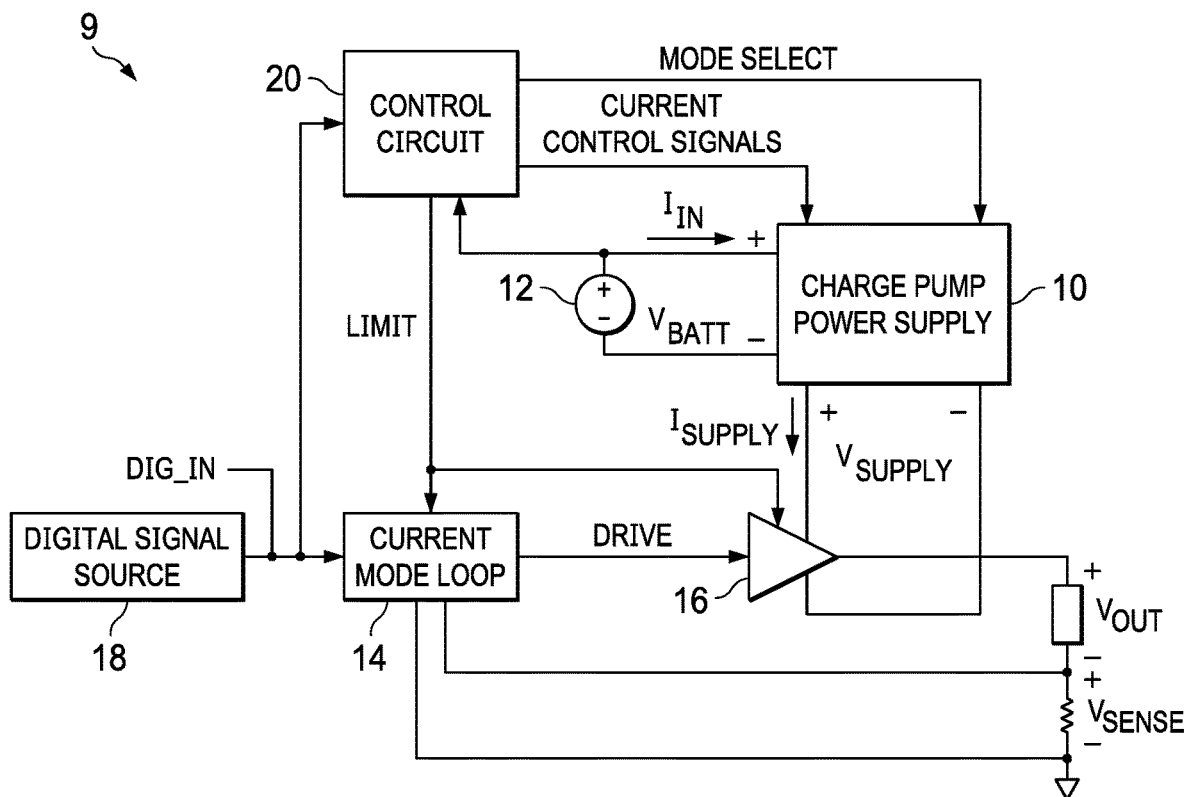
FIG. 2 is a block diagram of selected components of an example integrated circuit, which may be implemented as an audio integrated circuit of the personal audio device depicted in FIG. 1 or any other suitable device, in accordance with embodiments of the present disclosure.

FIG. 2 is a block diagram of selected components of an example IC 9, which may be implemented as audio IC 9 of personal audio device 1 or any other suitable device, in accordance with embodiments of the present disclosure. As shown in FIG. 2, a digital signal source 18 (e.g., a processor, digital signal processor, microcontroller, test equipment, or other suitable digital signal source) may supply a digital input signal DIG_IN to current mode loop 14, which may in turn process digital input signal DIG_IN to generate an analog driving signal DRIVE to a power amplifier 16 which may amplify or attenuate the analog driving signal DRIVE and provide an output signal $V_{OUT}$, which, in embodiments in which digital input signal DIG_IN, analog driving signal DRIVE, and output signal $V_{OUT}$ are audio signals, may operate a speaker, headphone transducer, and/or a line level signal output. However, application of IC 9 as depicted in FIG. 2 may not be limited to audio applications. In addition, although power amplifier 16 is depicted as a single-ended output generating a single-ended audio output signal $V_{OUT}$, in some embodiments, power amplifier 16 may comprise a differential output, and may thus provide a differential audio output signal $V_{OUT}$.

As shown in FIG. 2, current mode loop 14 may be configured to receive a current limit indicator signal LIMIT from control circuit 20 that may indicate whether control circuit 20 has limited a current (e.g., current $I_{IN}$ and/or current $I_{SUPPLY}$, described below) associated with charge pump power supply 10, as discussed elsewhere in this disclosure. As also described in greater detail below, responsive to current limit indicator signal LIMIT indicating that control circuit 20 has applied current limits to charge pump power supply 10, current mode loop 14 may apply one or more reactive protections in generating analog driving signal DRIVE.

Also as shown in FIG. 2, power amplifier 16 may be configured to receive current limit indicator signal LIMIT from control circuit 20. As also described in greater detail below, responsive to current limit indicator signal LIMIT indicating that control circuit 20 has applied current limits to charge pump power supply 10, an output impedance of power amplifier 16 may be controlled as a reactive protection when control circuit 20 has applied current limits.

A charge pump power supply 10 may provide the power supply rail inputs of a supply voltage $V_{SUPPLY}$ to power amplifier 16 and may receive a power source input, generally from a battery 12 or other power supply, which may provide an input voltage $V_{BATT}$ to charge pump power supply 10. A control circuit 20 may supply a mode select signal to charge pump power supply 10 that selects an operating mode of charge pump power supply 10 so as to adjust supply voltage $V_{SUPPLY}$ generated by charge pump power supply 10 according to expected and/or actual signal levels at the output of power amplifier 16. When low signal levels exist and/or are expected at amplifier output $V_{OUT}$, control circuit 20 may improve the power efficiency of audio IC 9 by varying the supply voltage $V_{SUPPLY}$ in conformity with the output signal $V_{OUT}$ or a signal (e.g., digital input signal DIG_IN) indicative of the output signal $V_{OUT}$. Accordingly, to maintain power efficiency, at any given time, control circuit 20 may select an operating mode from a plurality of operating modes in each operating mode operating charge pump power supply at a different supply voltage, $V_{SUPPLY}$, wherein the supply voltage $V_{SUPPLY}$ in one operational mode is a rational multiple or ratio of supply voltages of other operational modes.

Figure 3:
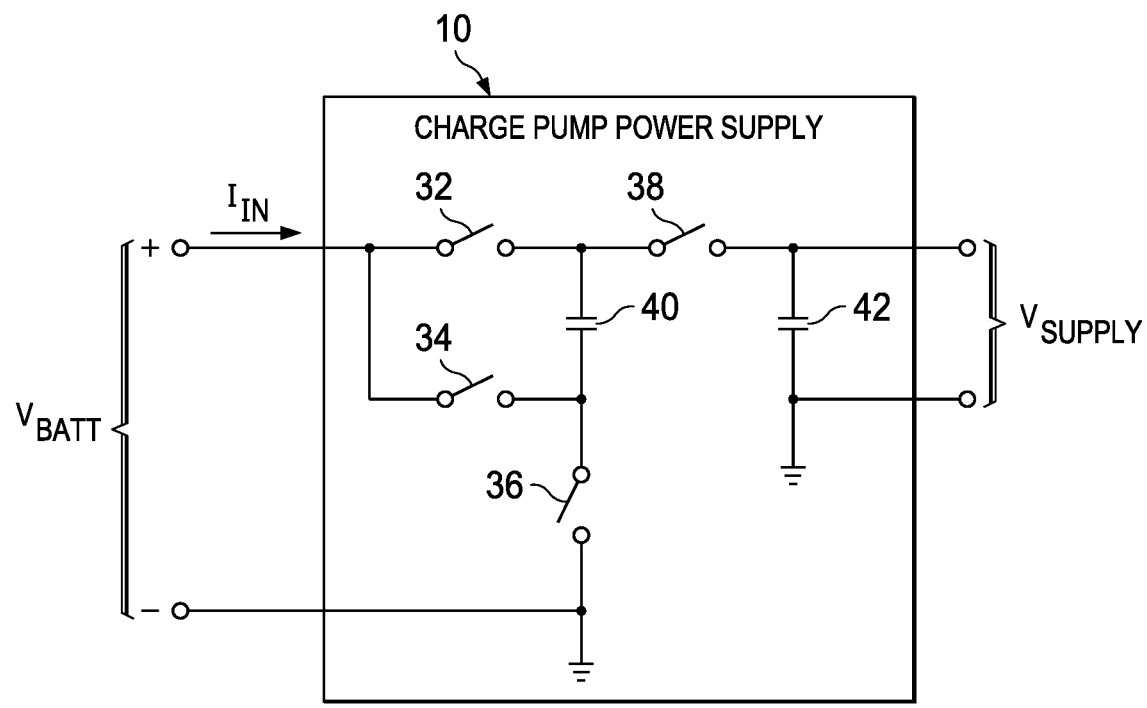
FIG. 3 is a block diagram of selected components of an example charge pump power supply, in accordance with embodiments of the present disclosure.

FIG. 3 is a block diagram of selected components of an example charge pump power supply 10, in accordance with embodiments of the present disclosure. Charge pump power supply 10 as shown in FIG. 3 may be configured to operate in two modes: a first mode in which the supply voltage $V_{SUPPLY}$ output by charge pump power supply 10 is equal to input voltage $V_{BATT}$, and a second mode in which the supply voltage $V_{SUPPLY}$ output by charge pump power supply 10 is equal to two times input voltage $V_{BATT}$. As shown in FIG. 3, charge pump power supply 10 may include switches 32, 34, 36, and 38, a flying capacitor 40, and a charge pump output capacitor 42.

Each switch 32, 34, 36, and 38 may comprise any suitable device, system, or apparatus for making a connection in an electric circuit when the switch is enabled (e.g., closed or on) and breaking the connection when the switch is disabled (e.g., open or off) in response to a control signal received by the switch. For purposes of clarity and exposition, control signals for switches 32, 34, 36, and 38 are not depicted, although such control signals would be present to selectively enable and disable switches 32, 34, 36, and 38. In some embodiments, a switch 32, 34, 36, and 38 may comprise an n-type metal-oxide-semiconductor field-effect transistor. In these and other embodiments, a switch 32, 34, 36, and 38 may comprise a p-type metal-oxide-semiconductor field-effect transistor. Switch 32 may be coupled between a positive input terminal of charge pump power supply 10 and a first terminal of flying capacitor 40. Switch 34 may be coupled between the positive input terminal of charge pump power supply 10 and a second terminal of flying capacitor 40. Switch 36 may be coupled between a negative input terminal of charge pump power supply 10 and a second terminal of flying capacitor 40. Switch 38 may be coupled between the first terminal of flying capacitor 40 and a first terminal of charge pump output capacitor 42.

Flying capacitor 40 and charge pump output capacitor 42 may each comprise a passive two-terminal electrical component used to store energy electrostatically in an electric field, which may generate a current in response to a time-varying voltage across the capacitor (or vice versa). Charge pump output capacitor 42 may be coupled between the output terminals of charge pump power supply 10, and thus may store supply voltage $V_{SUPPLY}$ output by charge pump power supply 10.

In the first mode, charge pump power supply 10 may operate in a single phase, wherein switch 34 may be disabled and switches 32, 36, and 38 may be enabled during operation, thus charging voltage $V_{SUPPLY}$ on charge pump output capacitor 42 to input voltage $V_{BATT}$. In the second mode, charge pump power supply 10 may sequentially operate in a charging phase in which switches 32 and 36 are enabled and switches 34 and 38 are disabled, allowing charge transfer from battery 12 to flying capacitor 40, and a transfer phase in which switches 32 and 36 are disabled and switches 34 and 38 are enabled, boosting the voltage on flying capacitor 40 and allowing charge transfer from flying capacitor 40 to charge pump output capacitor 42.

Although FIG. 3 depicts a particular implementation of a charge pump power supply 10 configured to switch between a first mode in which the boost ratio of supply voltage $V_{SUPPLY}$ and input voltage $V_{BATT}$ is 1, and a second mode in which the boost ratio of supply voltage $V_{SUPPLY}$ and input voltage $V_{BATT}$ is 2, the systems and methods herein may generally apply to charge pump power supplies having more than two modes of operation and/or boost ratios other than 1 or 2 (e.g., 1.5, 3, etc.). In addition, although FIG. 3 depicts a particular implementation of a charge pump power supply 10 having switches 32-38, a single flying capacitor 40, and a charge pump output capacitor 42, the systems and methods herein may generally apply to charge pump power supplies having any suitable topology of switches, one or more flyback capacitors, and one or more load capacitors.

As shown in FIGS. 2 and 3, battery 12 may supply a current $I_{IN}$ to charge pump power supply 10, and charge pump power supply 10 may generate a current $I_{SUPPLY}$ to power amplifier 16. As mentioned in the Background section of this application, it may be advantageous to limit the current $I_{IN}$ sourced from or sunk to battery 12 by charge pump power supply 10. Thus, in accordance with methods and systems of the present disclosure, control circuit 20 may also be configured to generate control signals as shown in FIG. 2 to limit input current $I_{IN}$. Examples of such current limiting are described in U.S. application Ser. No. 15/783,506 filed Oct. 13, 2017, U.S. application Ser. No. 15/800,743 filed Nov. 1, 2017, and U.S. application Ser. No. 15/823,140 filed Nov. 27, 2017, all of which are incorporated by reference herein. In addition, control circuit 20 may also be configured to generate control signals as shown in FIG. 2 to perform current mode throttling of output power, as described in greater detail below.

Thus, in operation, control circuit 20 may control an output power of charge pump power supply 10 by controlling a target current delivered to power amplifier 16. In some embodiments, control circuit 20 may limit the output power by controlling supply voltage $V_{SUPPLY}$ generated by charge pump power supply 10 based on a measurement of one or more variables (e.g., input voltage $V_{BATT}$, supply voltage $V_{SUPPLY}$, and/or a multiplication ratio) associated with charge pump power supply 10.

Figure 4:
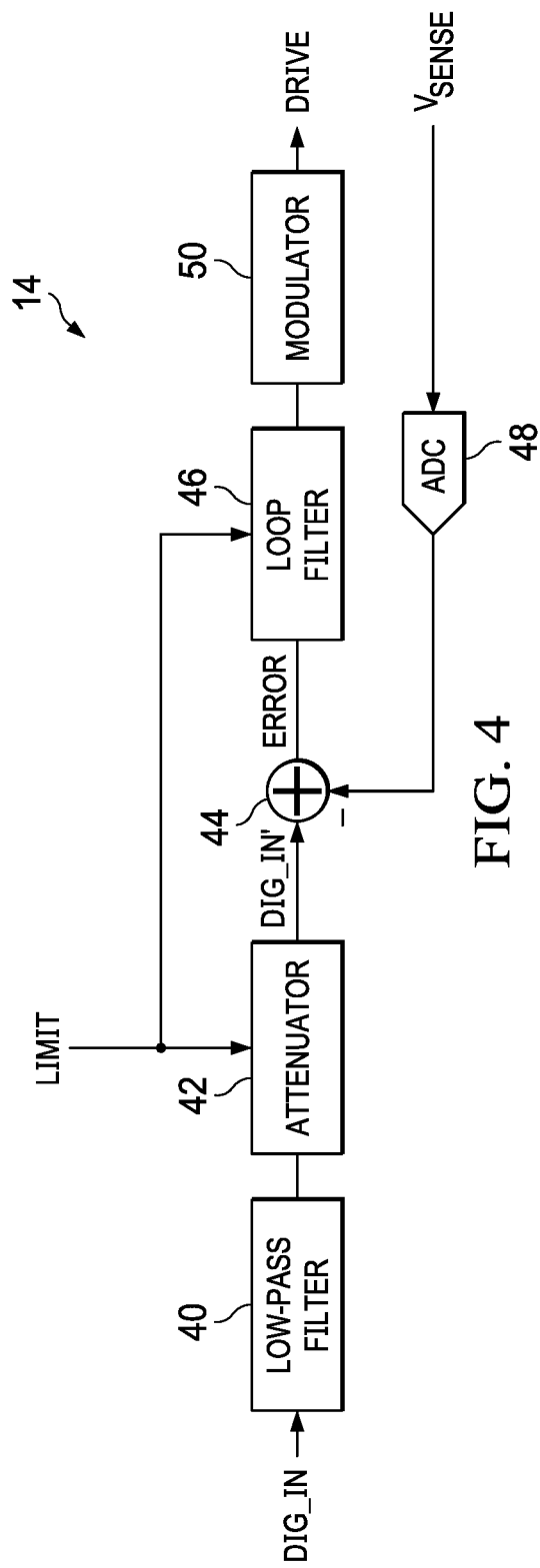
FIG. 4 is a block diagram of selected components of an example current mode loop, in accordance with embodiments of the present disclosure.

FIG. 4 is a block diagram of selected components of an example current mode loop 14, in accordance with embodiments of the present disclosure. In some embodiments, example current mode loop 14 of FIG. 4 may be used to implement current mode loop 14 of FIG. 2. As shown in FIG. 4, example current mode loop 14 may include a low-pass filter 40, an attenuator 42, a combiner 44, a loop filter 46, a modulator 50, and an analog-to-digital converter (ADC) 48 arranged as depicted. In operation, digital input signal DIG_IN may be a digital signal indicative of a desired current to be driven by power amplifier 16 to an output load coupled to power amplifier 16. Such current mode signal may be filtered by low-pass filter 40 to generate a filtered current mode signal. Attenuator 42 may receive such filtered current mode signal and current limit indicator signal LIMIT such that, when current limit indicator signal LIMIT indicates that control circuit 20 has limited a current associated with charge pump power supply 10, attenuator 42 attenuates the magnitude of the filtered current mode signal to generate a modified current mode signal DIG_IN'. When control circuit 20 is not in a current-limited mode, attenuator 42 may apply no attenuation (e.g., may apply a unity gain).

Although FIG. 4 illustrates low-pass filter 40 being prior to attenuator 42 in the signal path of current mode loop 14, in some embodiments, attenuator 42 may be placed/applied prior to low-pass filter 40. In yet other embodiments, the function of attenuator 42 may be incorporated into low-pass filter 40, such that filter coefficients of low-pass filter 40 are set in response to current limit indicator signal LIMIT to provide the attenuation in order to generate modified current mode signal DIG_IN'.

Combiner 44 may subtract a measured current signal generated by ADC 48 (e.g., based on an measured voltage $V_{SENSE}$ indicative of an output current delivered from power amplifier 16 to a load) from modified current mode signal DIG_IN' to generate an error signal ERROR. Loop filter 46 may filter error signal ERROR, wherein such filtered error signal may be modulated (e.g., pulse-width modulated, pulse-density modulated, etc.) by modulator 50 in order to generate analog driving signal DRIVE driven to power amplifier 16. As shown in FIG. 4, loop filter 46 may also receive current limit indicator signal LIMIT. Responsive to current limit indicator signal LIMIT indicating that control circuit 20 has applied a current limit to a current associated with charge pump power supply 10, loop filter 46 may apply a reactive compensation to its filtering functions. For example, in some embodiments, state variables of loop filter 46 may be controlled responsive to current limit indicator signal LIMIT indicating that control circuit 20 has applied current limiting. In some embodiments, control of such state variables of loop filter 46 may include freezing state variables of loop filter 46 responsive to current limit indicator signal LIMIT indicating that control circuit 20 has applied current limiting. In these and other embodiments, control of such state variables of loop filter 46 may include zeroing state variables of loop filter 46 responsive to current limit indicator signal LIMIT indicating that control circuit 20 has applied current limiting. In these and other embodiments, control of such state variables of loop filter 46 may include forcing error signal ERROR to zero, responsive to current limit indicator signal LIMIT indicating that control circuit 20 has applied current limiting, which may have the effect of freezing state variables of loop filter 46. The control of the state variables (e.g., freezing, resetting, etc.) may be maintained through the period in which control circuit 20 operates in a current limited mode, so as to cease updating state variables during the current limited mode.

Figure 5:
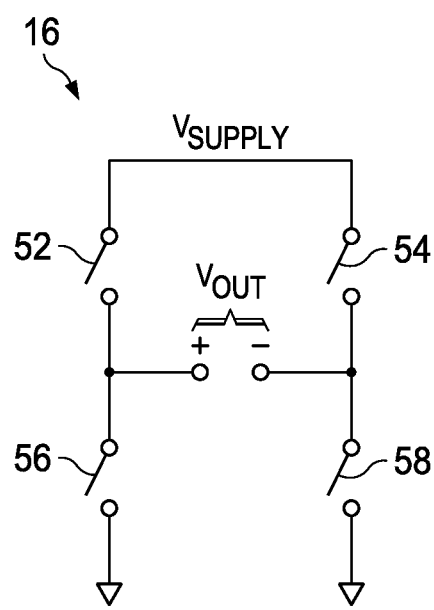
FIG. 5 is a block diagram of selected components of an example power amplifier, in accordance with embodiments of the present disclosure.

FIG. 5 is a block diagram of selected components of an example power amplifier 16, in accordance with embodiments of the present disclosure. In some embodiments, example power amplifier 16 of FIG. 5 may be used to implement power amplifier 16 of FIG. 2. As shown in FIG. 5, power amplifier 16 may include a Class-D amplifier having switches 52, 54, 56, and 58 which are driven by analog driving signal DRIVE (or a derivative thereof). For example, when analog driving signal DRIVE is a pulse modulated signal, analog driving signal DRIVE may drive switches 52 and 58 while an inverse of analog driving signal DRIVE may drive switches 54 and 56. As shown in FIG. 2 and described above, power amplifier 16 may be configured to receive current limit indicator signal LIMIT from control circuit 20, and, responsive to current limit indicator signal LIMIT indicating that control circuit 20 has applied current limits to charge pump power supply 10, an output impedance of power amplifier 16 may be controlled as a reactive protection when control circuit 20 has applied current limits. For example, in some embodiments, responsive to current limit indicator signal LIMIT indicating that control circuit 20 has applied current limits to charge pump power supply 10, power amplifier 16 may be set to a high-impedance state. In some embodiments, such high-impedance state may be achieved by forcing switches 52 and 54 to be disabled (e.g., off, open, deactivated) when current limit indicator signal LIMIT indicates that control circuit 20 has applied current limits. In other embodiments, such high-impedance state may be achieved by forcing switches 52, 54, 56, and 58 to be disabled (e.g., off, open, deactivated) when current limit indicator signal LIMIT indicates that control circuit 20 has applied current limits.

Switches 52, 54, 56, and 58 may be implemented in any suitable manner. For example, in some embodiments, each switch 52, 54, 56, and 58 may be implemented using an n-type metal-oxide-semiconductor field-effect transistor.

This disclosure encompasses all changes, substitutions, variations, alterations, and modifications to the exemplary embodiments herein that a person having ordinary skill in the art would comprehend. Similarly, where appropriate, the appended claims encompass all changes, substitutions, variations, alterations, and modifications to the exemplary embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative.

All examples and conditional language recited herein are intended for pedagogical objects to aid the reader in understanding this disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

What is claimed is:

1. A system comprising:
 a charge pump configured to boost an input voltage of the charge pump to an output voltage greater than the input voltage;
 a current mode control loop for current mode control of a power amplifier powered by the output voltage of the charge pump; and
 a controller configured to, in a current-limiting mode of the controller:
  control an output power of the charge pump to ensure that an input current of the charge pump is maintained below a current limit;
  control the power amplifier by placing the power amplifier into a high-impedance mode during the current-limiting mode; and
  control state variables of a loop filter of the current mode control loop during the current-limiting mode.

2. The system of claim 1, wherein the power amplifier comprises a Class D amplifier.

3. The system of claim 2, wherein placing the power amplifier into a high-impedance mode comprises deactivating at least two switches of the Class D amplifier during the current-limiting mode.

4. The system of claim 1, wherein controlling the state variables of the loop filter comprises resetting the state variables and ceasing update of the state variables during the current-limiting mode.

5. The system of claim 1, wherein controlling the state variables of the loop filter comprises freezing the state variables and ceasing update of the state variables during the current-limiting mode.

6. The system of claim 1, wherein the controller is further configured to, in the current-limiting mode of the controller, attenuate a reference signal input to the current mode control loop.

7. A method comprising, in a current-limiting mode of a system comprising a charge pump configured to boost an input voltage of the charge pump to an output voltage greater than the input voltage and a current mode control loop for current mode control of a power amplifier powered by the output voltage of the charge pump:

controlling an output power of the charge pump to ensure that an input current of the charge pump is maintained below a current limit;

controlling the power amplifier by placing the power amplifier into a high-impedance mode during the current-limiting mode; and controlling state variables of a loop filter of the current mode control loop during the current-limiting mode.

8. The method of claim 7, wherein the power amplifier comprises a Class D amplifier.

9. The method of claim 8, wherein placing the power amplifier into a high-impedance mode comprises deactivating at least two switches of the Class D amplifier during the current-limiting mode.

10. The method of claim 7, wherein controlling the state variables of the loop filter comprises resetting the state variables and ceasing update of the state variables during the current-limiting mode.

11. The method of claim 7, wherein controlling the state variables of the loop filter comprises freezing the state variables and ceasing update of the state variables during the current-limiting mode.

12. The method of claim 7, further comprising, in the current-limiting mode of the system, attenuating a reference signal input to the current mode control loop.

* * * * *